United States Patent
Li et al.

(10) Patent No.: US 9,523,895 B2
(45) Date of Patent: Dec. 20, 2016

(54) TFT-LCD ARRAY SUBSTRATE AND MANUFACTURING METHOD THEREOF

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Wei Li, Beijing (CN); Jeong Hun Rhee, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 33 days.

(21) Appl. No.: 14/251,987

(22) Filed: Apr. 14, 2014

(65) Prior Publication Data

US 2014/0220747 A1    Aug. 7, 2014

Related U.S. Application Data (62) Division of application No. 12/883,705, filed on Sep. 16, 2010, now Pat. No. 8,735,888.

(30) Foreign Application Priority Data

Sep. 18, 2009  (CN) .......................... 2009 1 0093385

(51) Int. Cl.
*G02F 1/1343* (2006.01)
*H01L 27/12* (2006.01)
(Continued)

(52) U.S. Cl.
CPC ........... *G02F 1/13439* (2013.01); *H01L 27/12* (2013.01); *H01L 27/124* (2013.01); *G02F 1/1368* (2013.01); *H01L 29/458* (2013.01)

(58) Field of Classification Search
CPC ............. H01L 27/1259; H01L 27/1288; H01L 27/124; H01L 27/14603; H01L 27/3248; H01L 21/823418; H01L 29/0843; H01L 29/41758; H01L 29/458; H01L 29/78618
See application file for complete search history.

(56) References Cited

U.S. PATENT DOCUMENTS

| | | | |
|---|---|---|---|
| 5,674,757 A | 10/1997 | Kim | |
| 5,717,224 A * | 2/1998 | Zhang | ............... G02F 1/136227 257/435 |

(Continued)

FOREIGN PATENT DOCUMENTS

| | | |
|---|---|---|
| CN | 1943039 A | 4/2007 |
| CN | 101520580 A | 9/2009 |

OTHER PUBLICATIONS

USPTO RR dated Nov. 6, 2012 in connection with U.S. Appl. No. 12/882,705.
(Continued)

*Primary Examiner* — Jerome Jackson, Jr.
*Assistant Examiner* — David Spalla
(74) *Attorney, Agent, or Firm* — Ladas & Parry LLP (57) ABSTRACT

An embodiment of the invention relates to a TFT-LCD array substrate comprising a substrate, a gate line and a data line formed on the substrate, a pixel electrode and a thin film transistor formed in a pixel region defined by the gate line and the data line, wherein the thin film transistor comprises a gate electrode, a source electrode, and a transparent drain electrode, and the transparent drain electrode is electrically connected with the pixel electrode.

8 Claims, 10 Drawing Sheets

(51) Int. Cl.
  *G02F 1/1368*   (2006.01)
  *H01L 29/45*    (2006.01)

(56) References Cited

U.S. PATENT DOCUMENTS

| | | | |
|---|---|---|---|
| 5,990,492 A * | 11/1999 | Kim | 257/59 |
| 7,215,387 B2 | 5/2007 | Yang et al. | |
| 7,333,161 B2 | 2/2008 | Chae et al. | |
| 7,626,206 B2 | 12/2009 | Ahn et al. | |
| 7,995,182 B2 | 8/2011 | Choi | |
| 2005/0142680 A1 | 6/2005 | Ha et al. | |
| 2006/0050191 A1* | 3/2006 | Park | G02F 1/136286 349/42 |
| 2006/0139548 A1 | 6/2006 | Ahn | |
| 2006/0192204 A1* | 8/2006 | Yamaguchi et al. | 257/72 |
| 2007/0075943 A1 | 4/2007 | Shin et al. | |
| 2009/0009677 A1* | 1/2009 | Yamazaki et al. | 349/43 |
| 2009/0311809 A1* | 12/2009 | Miyairi et al. | 438/22 |
| 2010/0155733 A1* | 6/2010 | Moon | G02F 1/136227 257/59 |
| 2010/0289977 A1* | 11/2010 | Liu | H01L 27/12 349/44 |

OTHER PUBLICATIONS

USPTO NFOA dated Jan. 16, 2013 in connection with U.S. Appl. No. 12/883,705.
USPTO FOA dated Nov. 8, 2013 in connection with U.S. Appl. No. 12/883,705.
USPTO NOA mailed Jan. 21, 2014 in connection with U.S. Appl. No. 12/883,705.

* cited by examiner

TFT-LCD ARRAY SUBSTRATE AND MANUFACTURING METHOD THEREOF

BACKGROUND

Embodiments of the invention relate to a thin film transistor liquid crystal display and a manufacturing method thereof.

Thin film transistor liquid crystal displays (TFT-LCDs) have advantages such as small volume, low power consumption, and free of radiation, and have prevailed in the current flat panel display market. Currently, the manufacturing method of a TFT-LCD mainly employs a five-patterning process and a four-pattern process. The five-patterning process comprises patterning of a gate line and a gate electrode, patterning of an active layer, patterning of source/drain electrodes, patterning of a through hole, and patterning of a pixel electrode. The four-patterning process comprises a step combining patterning of the active layer and patterning of the source/drain electrode into a single patterning process by using a half-tone or a grey tone mask based on the five-patterning process.

A half-tone or a grey tone mask is provided with a completely transparent region, a partially transparent region and a non-transparent region. For example, the non-transparent region corresponds to a region where the source electrode and the drain electrode are located, the partially transparent region corresponds to a region where the TFT channel region pattern is located, and the completely transparent region corresponds to a region other than the above regions. In practice, in order to prevent ultraviolet light from passing through the completely transparent region into the TFT channel region, the width of the drain electrode is increased so as to ensure the etching quality of the TFT channel region. However, this increases the size of the drain electrode in the thin film transistor, and therefore causes the technical drawbacks such as small effective light transmitting area and low aperture ratio.

SUMMARY

An embodiment of the invention discloses TFT-LCD array substrate comprising a substrate, a gate line and a data line formed on the substrate, a pixel electrode and a thin film transistor formed in a pixel region defined by the gate line and the data line. The thin film transistor comprises a gate electrode, a source electrode, and a transparent drain electrode, and the transparent drain electrode is electrically connected with the pixel electrode.

Another embodiment of the invention discloses manufacturing method of a TFT-LCD array substrate comprising: Step 1, depositing a gate metal film on a substrate, and forming patterns including a gate line and a gate electrode by a patterning process; Step 2, forming patterns including an active layer, a data line, a source electrode and a passivation layer via hole in a passivation layer with on the substrate after step 1, and the passivation layer via hole exposing the surface of the active layer in the drain electrode region; and Step 3, depositing a transparent conductive film on the substrate after step 2, forming patterns of a transparent drain electrode and a pixel electrode which are in an integral structure and connected with each other.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Hereinafter, the embodiments of the invention will be described in detail with reference to the accompanying drawings. In the drawings, the thickness of each film and the dimension of each region are not drawing based on actual scale in a TFT-LCD array substrate but only used to describe the sprit and scope of the invention schematically.

Figure 1:
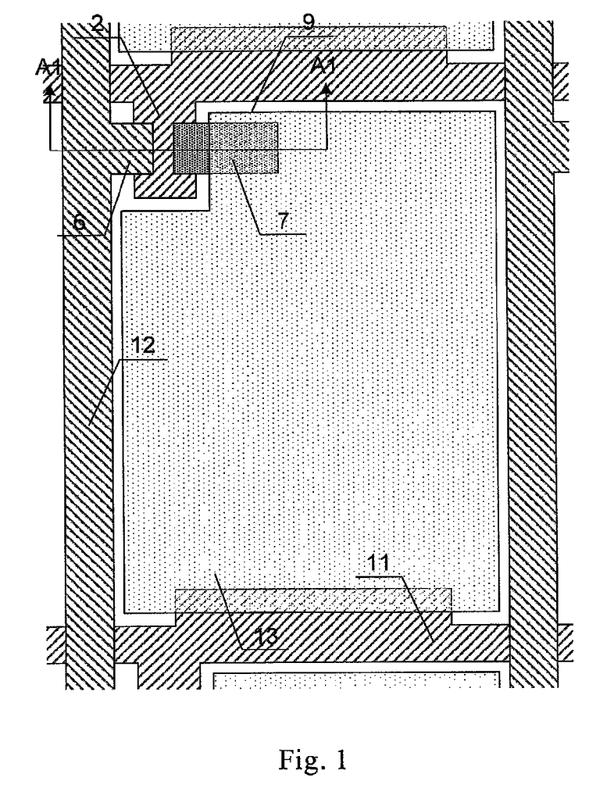
FIG. 1 is a plan view of an array substrate of TFT-LCD according to an embodiment of the invention.
Figure 2:
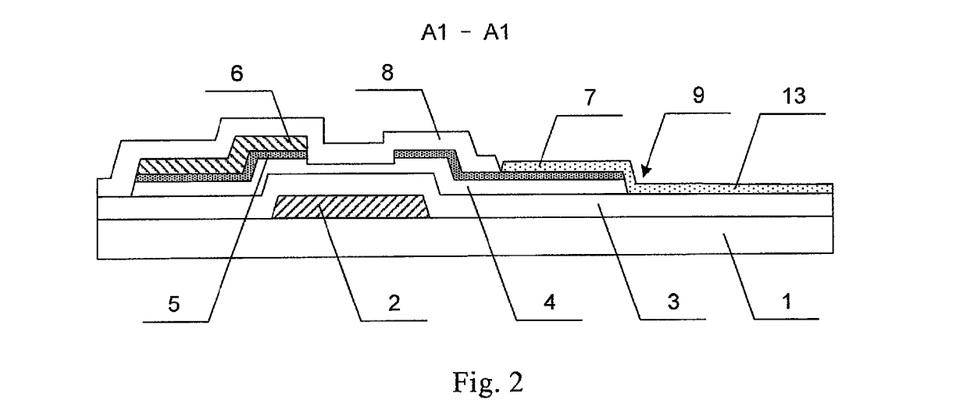
FIG. 2 is a cross-sectional view taken along a line A1-A1 in FIG. 1.

FIG. 1 is a plan view of an array substrate of TFT-LCD according to an embodiment of the invention, which reflects a structure of one pixel region. FIG. 2 is a cross-sectional view taken along a line A1-A1 in FIG. 1.

As shown in FIGS. 1 and 2, the TFT-LCD substrate according an embodiment of the invention comprises a plurality of gate lines 11, a plurality of data lines 12, a plurality of pixel electrodes 13 and a plurality of thin film transistors T1, which are formed on a substrate. On the whole substrate, the plurality of gate lines 11 and the plurality of data lines 12 define a plurality of pixel regions arranged in a matrix, and in each pixel region a thin film transistor T1 and a pixel electrode 13. The gate line is used to provide an "ON" or "OFF" signal to the thin film transistor T1, and the thin film transistor T1 is used to control the date line 12 to provide a data voltage to the pixel electrode 13. Specifically, the thin film transistor T1 according to the embodiment of the invention comprises a gate electrode 2, an active layer (including a semiconductor layer 4 and a doped semiconductor layer 5), a source electrode 6 and a transparent drain electrode 7. The gate line 11 and the gate electrode 2 are formed on the substrate and connected with each other. A gate insulating film 3 is formed on the gate line 11 and the gate electrode 2 and covers the whole substrate 1. The active layer is formed on the gate insulating layer and located over the gate electrode 2. On one side of the gate electrode 2, a source electrode region 6 is formed; and on the other side of the gate electrode 2, a drain electrode region 7 is formed. The source electrode 6 is located in the source electrode region, and the transparent drain electrode 7 is located in the drain electrode region. A TFT channel region is formed between the source electrode region and the drain electrode region. The doped semiconductor layer 5 in the TFT channel region is etched away and the semiconductor layer 4 therein is partially etched in the thickness direction, so that the semiconductor layer 4 in the TFT channel region is exposed. A passivation layer 8 is formed on the above patterns with a passivation layer via hole 9 provided in the display region. The passivation layer via hole 9 corresponds to a part or all of the drain electrode region, so that the surface of the doped semiconductor layer of the active layer in a part or all of the drain electrode region is exposed. A transparent conductive film is formed on the passivation layer 8 and within the passivation layer via hole 9. The part of the transparent conductive film in the display region forms the pixel electrode 13, and the part of the transparent conductive film in the drain electrode region constitutes the transparent drain electrode 7. The transparent drain electrode 7 is connected with the doped semiconductor layer in the active layer, and pixel electrode 13 and the transparent drain electrode 7 are in an integral structure so that they are electrically connected with each other. The embodiment of the invention increases the light transmitting area of the pixel region and improves the aperture ratio by using a transparent drain electrode.

FIGS. 3-13 are schematic views showing the manufacturing process of the TFT-LCD array substrate according to the embodiment of the invention. In the following description, a patterning process comprises processes such as applying photoresist, masking, exposing and developing of photoresist, etching and removing photoresist, and a positive photoresist is used as an example.

Figure 3:
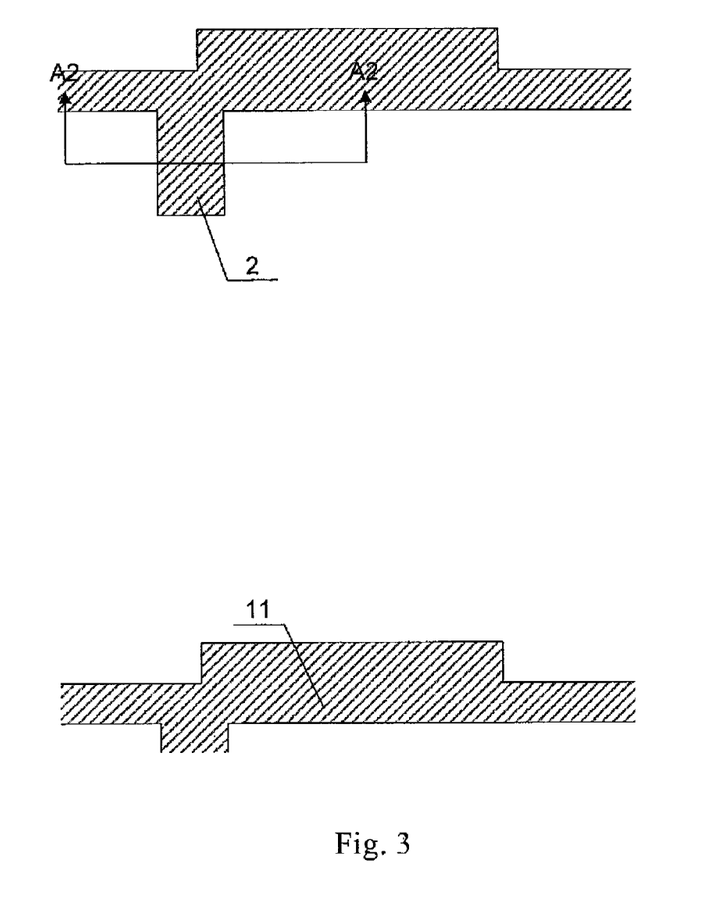
FIG. 3 is a plan view of the array substrate of TFT-LCD after a first patterning process according to an embodiment of the invention.
Figure 4:
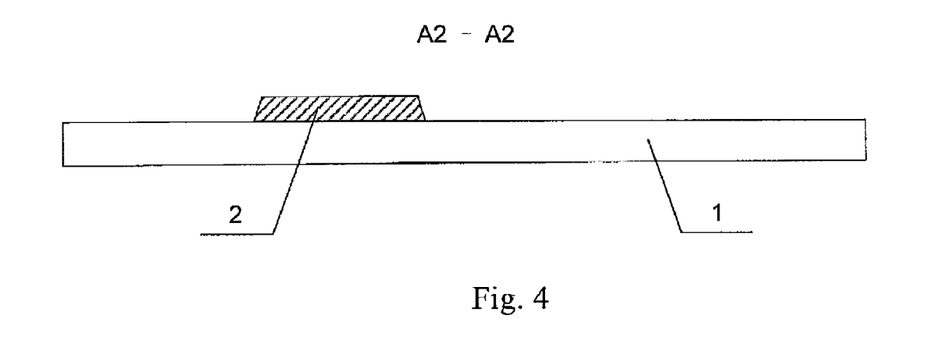
FIG. 4 is a cross-sectional view taken along a line A2-A2 in FIG. 3.

FIG. 3 is a plan view of the array substrate of TFT-LCD after a first patterning process according to an embodiment of the invention, which reflects a structure of one pixel unit. FIG. 4 is a cross-sectional view taken along a line A2-A2 in FIG. 3. First, a gate metal film is deposited on a substrate (for example, a glass substrate or a silica substrate) 1 by a magnetic sputtering method or a thermal evaporation method. The gate metal film may be a single-layer film of chromium, copper, aluminum, aluminum alloy or molybdenum, or a multiple-layer film composed of the above single-layer films. The gate metal film is patterned with a normal mask so as to form patterns of a gate electrode 2 and a gate line 11 connected with each other, as shown in FIGS. 3 and 4.

Figure 5:
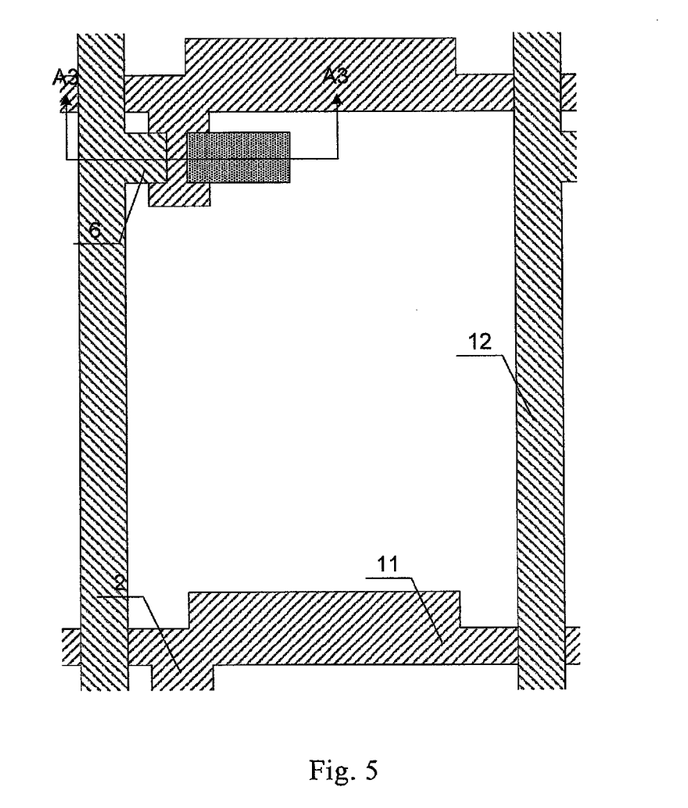
FIG. 5 is a plan view of the array substrate of TFT-LCD after a second patterning process according to an embodiment of the invention.
Figure 6:
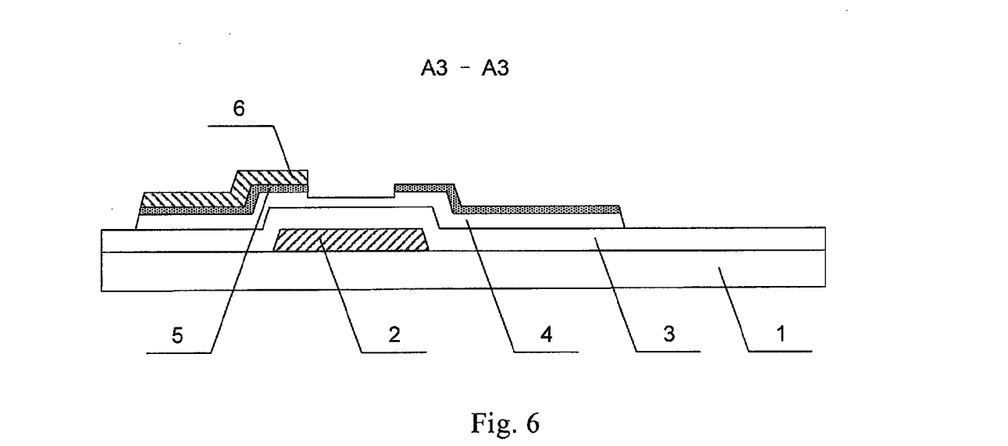
FIG. 6 is a cross-sectional view taken along a line A3-A3 in FIG. 5.

FIG. 5 is a plan view of the array substrate of TFT-LCD after a second patterning process according to an embodiment of the invention, which reflects a structure of one pixel region. FIG. 6 is a cross-sectional view taken along a line A3-A3 in FIG. 5. On the substrate as shown in FIG. 3, a gate insulating layer, a semiconductor film, a doped semiconductor film and a source/drain metal film are deposited sequentially, and then patterns including an active layer, a data line 12, and a source electrode 6 are formed by a patterning process using a three-tone mask, as shown in FIGS. 5 and 6. The second patterning process according to the embodiment of the invention is a multiple-step etching method, and it is described as follows.

Figure 7:
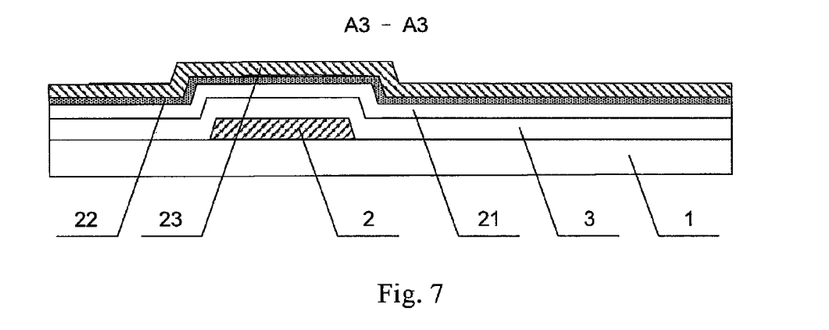
FIG. 7 is a cross-sectional view of the array substrate of TFT-LCD taken along the line A3-A3 after depositing each film in the second patterning process according to the embodiment of the invention.

FIG. 7 is a cross-sectional view of the array substrate of TFT-LCD taken along the line A3-A3 after depositing each film in the second patterning process according to the embodiment of the invention. The gate insulating film 3, the semiconductor film 21 and the doped semiconductor film 22 are deposited sequentially by a plasma enhanced chemical vapor deposition (PECVD), and then the source/drain metal film 23 is deposited by a magnetic sputtering or a thermal evaporation, as shown in FIG. 7. The gate insulating layer 3 may be an oxide, a nitride or an oxynitride, the source/drain metal film 23 may be a single-layer film of chromium, copper, aluminum, aluminum alloy or molybdenum, or a multiple-layer film composed of the above single-layer films.

Figure 8:
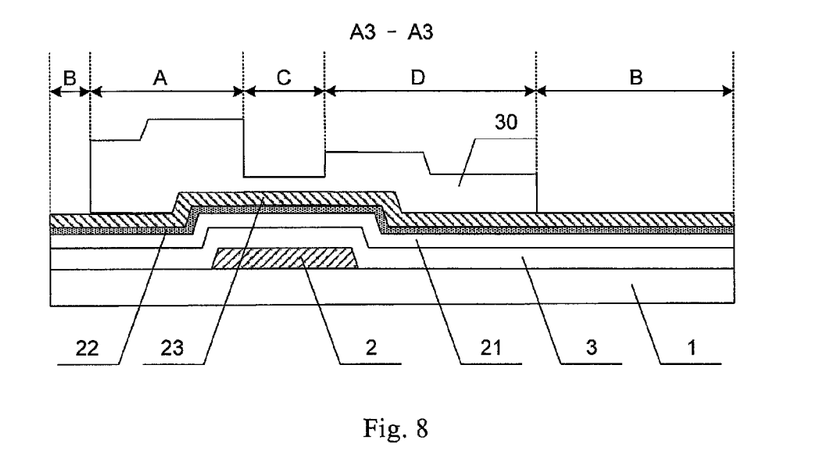
FIG. 8 is a cross-sectional view of the array substrate of TFT-LCD taken along the line A3-A3 after performing exposure and development processes in the second patterning process according to the embodiment of the invention.

FIG. 8 is a cross-sectional view of the array substrate of TFT-LCD taken along the line A3-A3 after performing exposure and development processes in the second patterning process according to the embodiment of the invention. First, a layer of photoresist 30 with a thickness of 25000 Å to 30000 Å is applied on the source/drain metal film 23, and then the photoresist 30 is exposed by using a three-tone mask. After development, the photoresist 30 is formed with a non-exposed region A (photoresist-completely-remained region), completely exposed region B (photoresist-completely-removed region), a first partially exposed region C (first photoresist-partially-remained region) and a second partially exposed region D (second photoresist-partially-remained region), as shown in FIG. 8. The thickness of the photoresist in the non-exposed region A is 25000 Å to 30000 Å and corresponds to a region where the patterns of the data line and the source electrode are located; the thickness of the photoresist in the first partially exposed region C is 3000 Å to 6000 Å and corresponds to a region where the pattern of the TFT channel region is located; the thickness of the photoresist in the second partially exposed region D is 12000 Å to 18000 Å and corresponds to a drain electrode region; and the photoresist in the completely exposed region B is completely removed so as to expose the source/drain metal film 23 and corresponds to a region other than the above regions.

Figure 9:
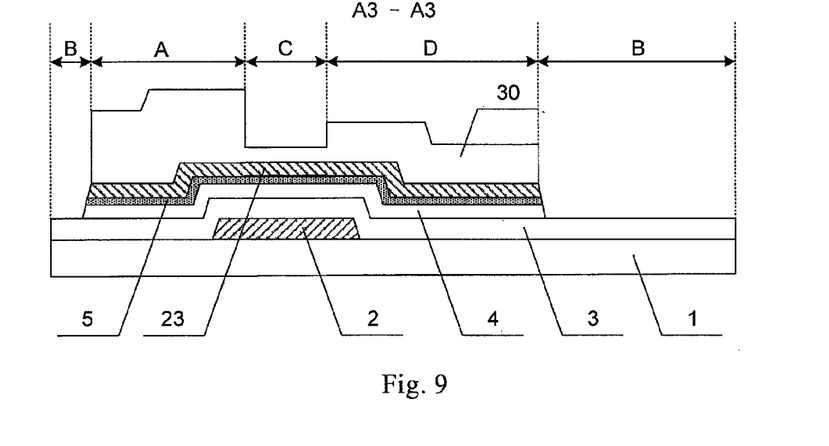
FIG. 9 is a cross-sectional view of the array substrate of TFT-LCD taken along the line A2-A2 after a first etching process in the second patterning process according to the embodiment of the invention.

FIG. 9 is a cross-sectional view of the array substrate of TFT-LCD taken along the line A2-A2 after a first etching process in the second patterning process according to the embodiment of the invention. In the completely exposed region B, first, the source/drain metal film 23 is etched away by a wet etching process, and then the doped semiconductor film 22 and the semiconductor film 21 are etched away by a dry etching process, so as to form the patterns of the data line and the active layer. The active layer comprises the stack of the semiconductor layer 4 and the doped semiconductor layer 5, as shown in FIG. 9.

Figure 10:
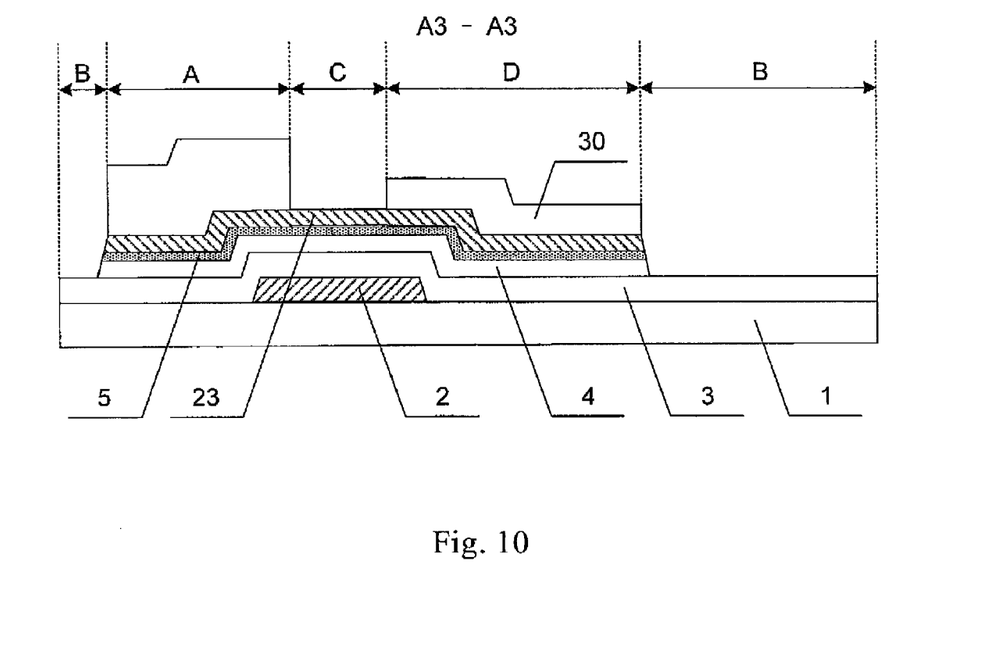
FIG. 10 is a cross-sectional view of the array substrate of TFT-LCD taken along the line A3-A3 after an ashing process in the second patterning process according to the embodiment of the invention.

FIG. 10 is a cross-sectional view of the array substrate of TFT-LCD taken along the line A3-A3 after an ashing process in the second patterning process according to the embodiment of the invention. By an ashing process, the photoresist in the first partially exposed region C is removed so as to expose the source/drain metal film 23 in the region, as shown in FIG. 10. Due to the ashing process, the thickness of the photoresist in the non-exposed region A and the second partially exposed region D is also reduced correspondingly, but the two regions are still covered by the remaining photoresist 30.

Figure 11:
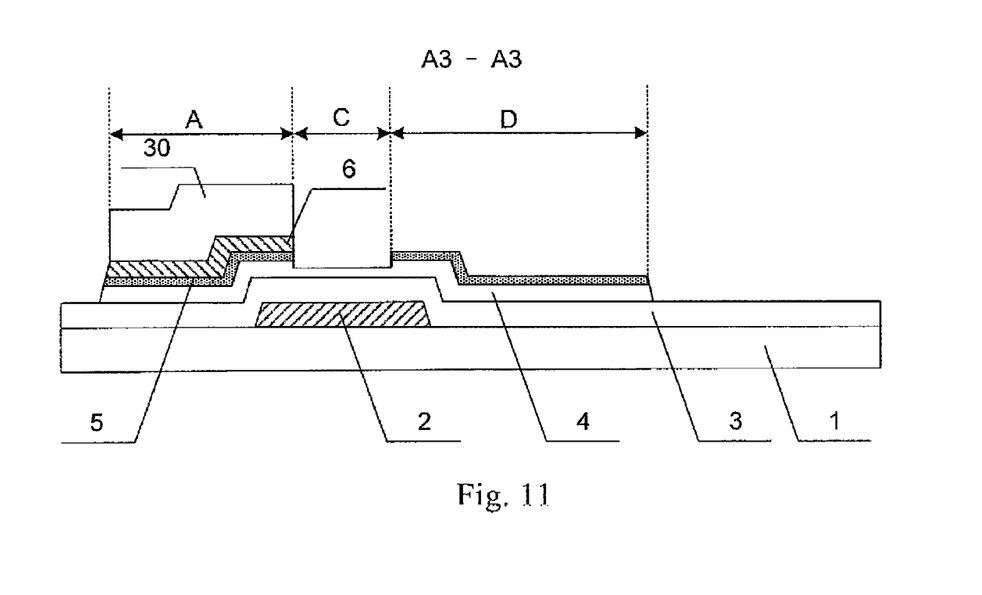
FIG. 11 is a cross-sectional view of the array substrate of TFT-LCD taken along the line A3-A3 after performing a second etching process in the second patterning process according to the embodiment of the invention.

FIG. 11 is a cross-sectional view of the array substrate of TFT-LCD taken along the line A3-A3 after performing a second etching process in the second patterning process according to the embodiment of the invention. By a second dry etching process, the source/drain metal film 23 and the doped semiconductor layer 5 in the first partially exposed region C are etched away, and the semiconductor layer 4 in the region is etched partially in the thickness direction, so that the semiconductor layer 4 is exposed. Simultaneously, the source/drain metal film 23 in the second partially exposed region D is also etched away so as to expose the doped semiconductor layer in the drain electrode region and form the patterns of the source electrode, drain electrode and the TFT channel region, as shown in FIG. 11. At the beginning of the etching process, although the second partially exposed region D is covered with the remaining photoresist 30, the thickness of the photoresist 30 in the region is reduced along with the etching of the first partially exposed region C until it is removed completely. At the time, the first and second partially exposed regions C and D are etched simultaneously, and finally, the semiconductor layer 4 is exposed in the first partially exposed region C and the doped semiconductor layer 5 is exposed in the second partially exposed region D. For example, it is assumed that, before the second etching process, the thickness of the remaining photoresist 30 in the second partially exposed region D is about 8000 Å, the thickness of the source/drain metal film is about 2000 Å, the thickness of the doped semiconductor layer is 500 Å, the thickness of the semiconductor layer is 2500 Å, the etching velocity of the source/drain metal film is about 2000 Å/m, the etching velocity of the doped semiconductor layer and the semiconductor layer is about 2000 Å/m, and the etching velocity of the photoresist is about 8000 Å/m. In this case, when the source/drain metal film in the first partially exposed region C is completely etched, the photoresist in the second partially exposed region D can be just removed completely so as to expose the source/drain metal film in the second partially exposed region D; next, when the doped semiconductor layer and the semiconductor layer are etched in the first partially exposed region C, the source/drain metal film in the second partially exposed region D is also etched; when the source/drain metal film in the second partially exposed region D is etched away so as to expose the doped semiconductor layer in the region, the doped semiconductor layer in the first partially exposed region C is etched away and the semiconductor layer in this region is partially etched in the thickness direction so that the thickness of the semiconductor film in the channel region is about 1000 Å.

Finally, the remained photoresist is removed, and the second patterning process for the TFT-LCD array substrate according to the embodiment of the invention is completed. In the patterning process, the gate line 11 and the data line 12 define the pixel region, the active layer (including the stack of the semiconductor layer 4 and the doped semiconductor layer 5) is formed on the gate electrode 2. The source electrode region is formed on one side of the gate electrode 2, and the drain electrode region is formed on other side of the gate electrode 2. The source electrode 6 is located within the source electrode region, and the doped semiconductor layer 5 of the active layer is exposed in the drain electrode region. The TFT channel region is formed between the source electrode region and the drain electrode region. The doped semiconductor layer 5 in the TFT channel region is etched away and the semiconductor layer 4 in the region is partially etched in the thickness direction, so that the semiconductor layer 4 in the TFT channel region is exposed, as shown in FIGS. 5 and 6. In practice, three-tone masks of various forms can be employed, for example, a partially transmitting mask with slits. For the partially transmitting mask with slits, the transmittances in the four different regions are 100%, 40-50%, 10-20% and 0, respectively. Therefore, after exposure and development, the thickness of the photoresist in the non-exposed region A (transmittance is 0) is 25000 Å to 30000 Å, and it is substantially not changed; in the completely exposed region B (transmittance is 100%), there is no photoresist remained, the thickness of the photoresist in the first partially exposed region C (transmittance is 40-50%) is 3000 Å to 6000 Å; and the thickness of the photoresist in the second partially exposed region D (transmittance is 10-20%) is 12000 Å to 18000 Å.

Figure 12:
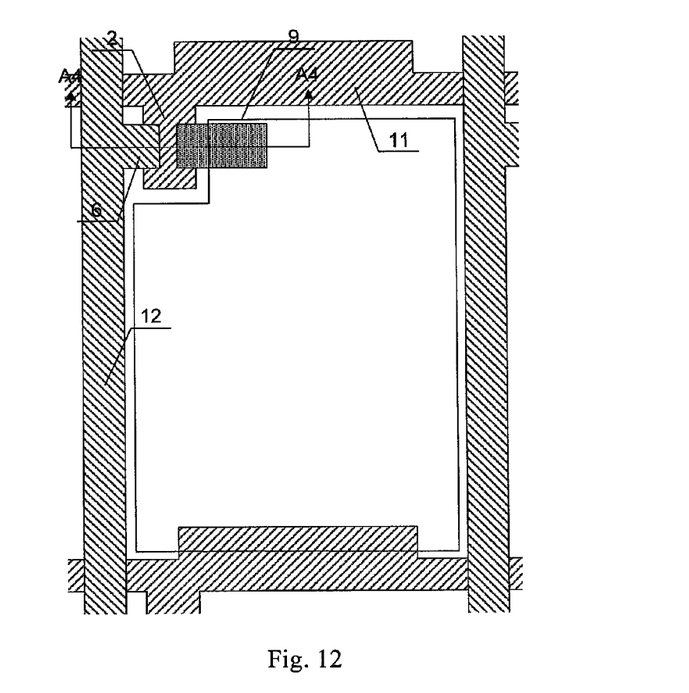
FIG. 12 is a plan view of the array substrate of TFT-LCD after a third etching process according to the embodiment of the invention.
Figure 13:
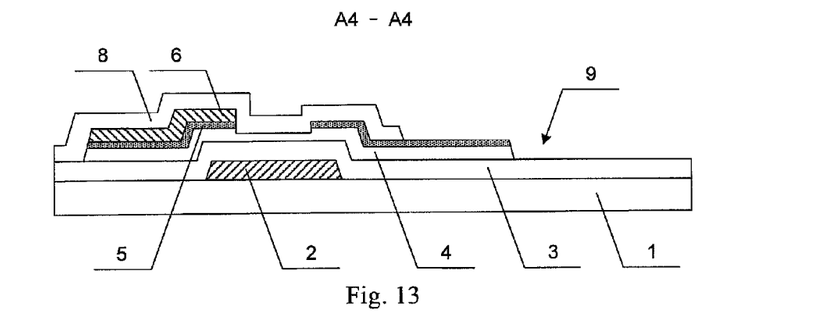
FIG. 13 is a cross-sectional view taken along a line A4-A4 in FIG. 12.

FIG. 12 is a plan view of the array substrate of TFT-LCD after a third etching process according to the embodiment of the invention, which reflects a structure of one pixel unit. FIG. 13 is a cross-sectional view taken along a line A4-A4 in FIG. 12. On the substrate after the above patterning process, a passivation layer 8 is deposited by a PECVD method. The passivation layer 8 may comprise oxide, nitride or oxynitride. The passivation layer 8 is patterned with a normal mask so as to form a passivation layer via hole 9. The passivation layer via hole 9 is located in the display region and comprises a part or all of drain electrode region so as to expose the surface of the doped semiconductor layer in a part or all of the drain electrode region. In addition, the via hole 9 also comprises the pixel electrode region, as shown in FIGS. 12 and 13. In the patterning process, the patterns of the gate connecting line via hole in the gate line PAD and the data connecting line via hole in the data line PAD are also formed simultaneously. The process for forming the patterns of gate connecting line via holes and the data connecting line via holes is widely used in the current patterning processes, which will not be described repeatedly.

Finally, on the substrate after the above patterning process, a transparent conductive film is deposited by a magnetic sputtering or thermal evaporation method. The transparent conductive film may be indium tin oxide (ITO), indium zinc oxide (IZO) or aluminum zinc oxide (AZO) and the like. A transparent drain electrode 7 and a pixel electrode 13, which are in an integral structure and connected with each other, are formed within the passivation layer via hole 9 and on the passivation layer 8 by a patterning process with a normal mask. The pixel electrode 13 is located in the display region, the transparent drain electrode 7 is located in the drain electrode region, and the transparent drain electrode 7 is connected with the doped semiconductor layer in the active layer, as shown in FIGS. 1 and 2.

The embodiment provides a TFT-LCD array substrate with a transparent drain electrode, which increases the light transmitting area of the pixel region and improves the aperture ratio effectively. The increase of the aperture ratio gives rise to increase of the brightness, and therefore the necessary brightness of the back light can be decreased, and the power consumption and cost can be saved.

It should be noted that the above manufacturing method for the TFT-LCD array substrate and the resulted structure are only one example. Those skilled in that art may implement similar structures by changing the processes. For example, the second patterning process according to the embodiment of the invention may be divided into two patterning processes, i.e., forming the pattern of the active layer by a patterning process with a normal mask, and forming the patterns including the data line and the source electrode by a patterning process with a half tone or grey tone mask. Or, for example, in the second patterning process for the TFT-LCD array substrate according to the embodiment of the invention, a part of source/drain metal film may be retained at a position in the second partially exposed region D closing to the source electrode so that a pattern of metal drain electrode of metal film material, i.e., the metal drain electrode is formed on the active layer and located on one side of the TFT channel region and opposite to the source electrode which is provided on the other side of the TFT channel region. Both the metal drain electrode and the transparent drain electrode are located at the same side of the TFT channel region and the transparent drain electrode is at the outer side of the metal drain electrode. Or, for example, in the third patterning process for the TFT-LCD array substrate according to the embodiment of the invention, the passivation layer via hole 9 may only be provided in the drain electrode region and expose a part or all of the drain electrode region. These modifications are in the spirit and scope of the invention.

FIGS. 14a-14g are schematic views showing another manufacturing process of the array substrate of TFT-LCD according to another embodiment of the invention, which are cross-sectional views taken along the line A3-A3 in FIG. 5. In the manufacturing process, the first patterning process, the third patterning process and the fourth patterning process are the same to those in the manufacturing process shown in FIGS. 3-13, which will not be described repeatedly. The second pattern process is described as follows.

Figure 14A:
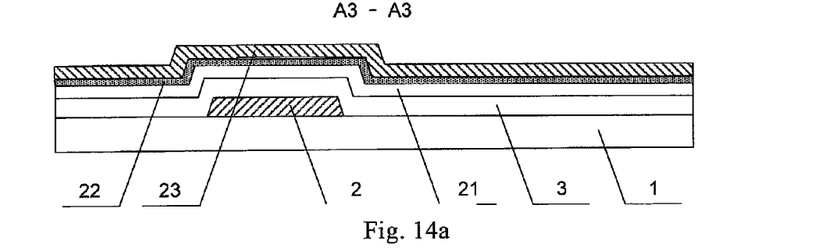
FIGS. 14a-14g are schematic views showing another manufacturing process of the array substrate of TFT-LCD according to an embodiment of the invention.
Figure 14B:
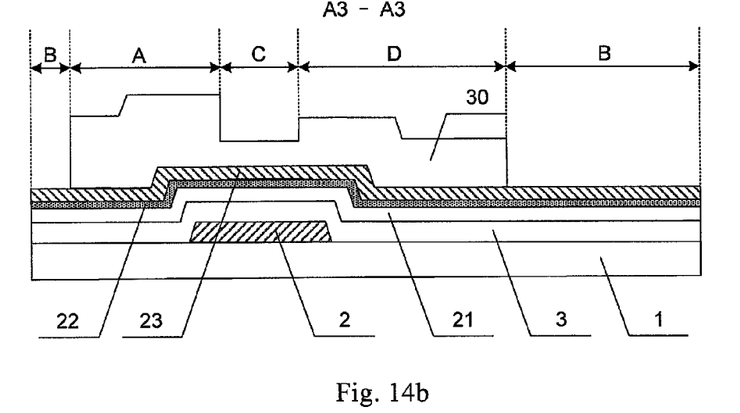
Figure 14C:
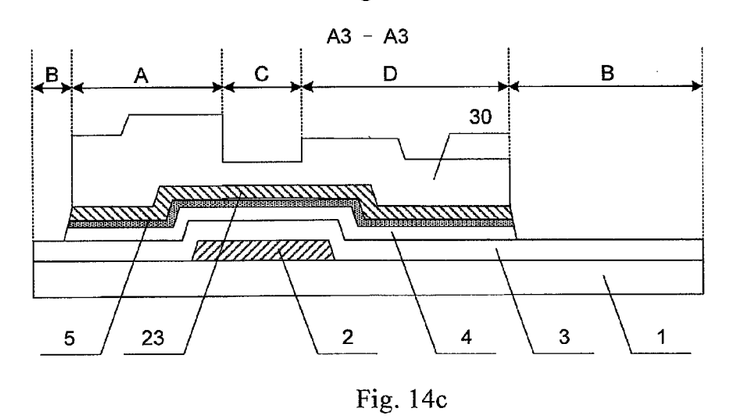
Figure 14D:
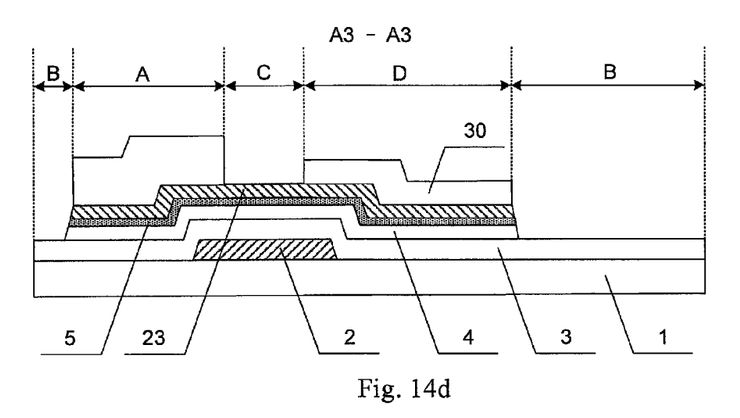
Figure 14E:
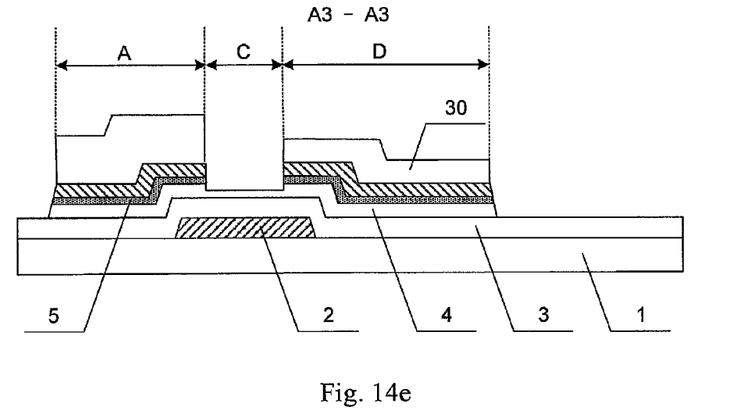
Figure 14F:
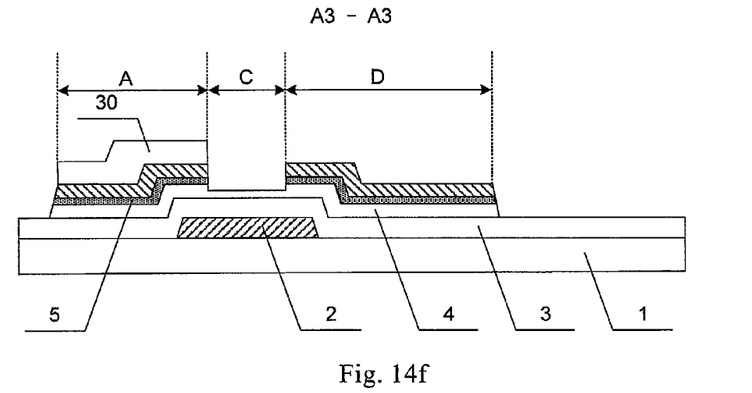
Figure 14G:
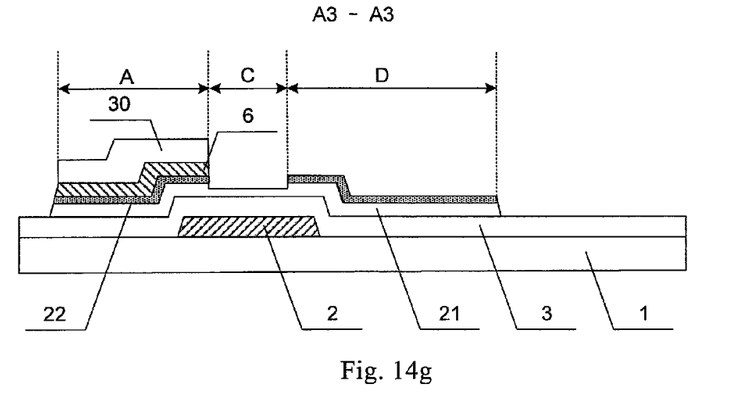

First, a gate insulating layer 3, a semiconductor film 21 and a doped semiconductor film 22 are deposited sequentially by a PECVD method, then a source/drain metal film 23 is deposited by the magnetic sputtering or thermal evaporation method, as shown in FIG. 14a. A layer of photoresist 30 is then applied on the source/drain metal film 23, and the photoresist is exposed by a three-tone mask. After development, the photoresist 30 is formed with a non-exposed region A (photoresist-completely-remained region), a completely exposed region B (photoresist-completely-removed region), a first partially exposed region C (a first photoresist-partially-remained region) and a second partially exposed region D (a second photoresist-partially-remained region), as shown in FIG. 14b. The non-exposed region A corresponds to a region where the patterns of the data line and the source electrode are located; the first partially exposed region C corresponds to a region where the pattern of the TFT channel region is located; the second partially exposed region D corresponds to a drain electrode region; and the completely exposed region B corresponds to a region other than the above regions. The thickness of the photoresist in the non-exposed region A is larger than that in the second partially exposed region D, and the thickness of the photoresist in the second partially exposed region D is larger than that in the first partially exposed region. In the completely exposed region B, the source/drain metal film 23 is firstly etched away by a wet etching process, then the doped semiconductor film 22 and the semiconductor film 21 are etched away by a dry etching process so as to form the patterns of the data line and the active layer, and the active layer includes the stack of the semiconductor layer 4 and the doped semiconductor layer 5, as shown in FIG. 14c. By a first ashing process, the photoresist in the first partially exposed region C is removed so as to expose the source/drain metal film 23 in this region, as shown in FIG. 14d. By a second dry etching process, the source/drain metal film 23 and the doped semiconductor layer 5 in the first partially exposed region C is etched away and the semiconductor layer 4 in the region is partially etched in the thickness direction so as to exposed the semiconductor layer 4, as shown in FIG. 14e. By a second ashing process, the photoresist in the second partially exposed region D is removed so as to expose the source/drain metal film in the region, as shown in FIG. 14f. By a third wet etching process, the source/drain metal film 23 in the second partially exposed region D is etched away so as to expose the doped semiconductor layer in the drain electrode region, as shown in FIG. 14g. Finally, the remaining photoresist 30 is removed, and the second patterning process for the TFT-LCD array substrate according to the embodiment of the invention is completed.

Compared with the manufacturing process shown in FIGS. 3-13, in the present embodiment, the TFT channel region is formed by a dry etching process and the source/drain metal film in the drain electrode is removed by a wet etching process.

FIGS. 15-18 are schematic views showing a manufacturing process of the array substrate of TFT-LCD according to still another embodiment of the invention. The manufacturing process is a manufacturing solution in which the metal drain electrode is etched when the passivation layer via hole 9 is formed. In the manufacturing solution, the first patterning process and the fourth patterning process are the same as those in the manufacturing process shown in FIGS. 3-13, which will not be described repeatedly. In the second patterning process, the patterns of the active layer, the data line, the source electrode and the metal drain electrode are formed by a patterning process with a half tone or grey tone mask, In the third patterning process, the metal drain electrode is etched in part or completely when the passivation layer via hole is formed so as to expose the doped semiconductor layer in the drain electrode region. The second patterning process in the manufacturing method is described as follows.

Figure 15:
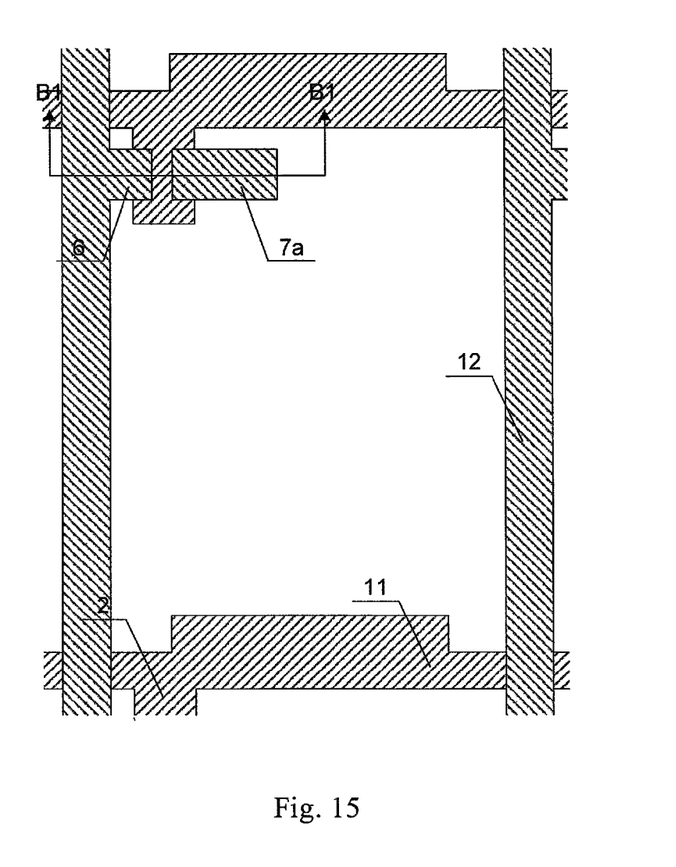
FIGS. 15-18 are schematic views showing still another manufacturing process of the array substrate of TFT-LCD according to an embodiment of the invention.
Figure 16:
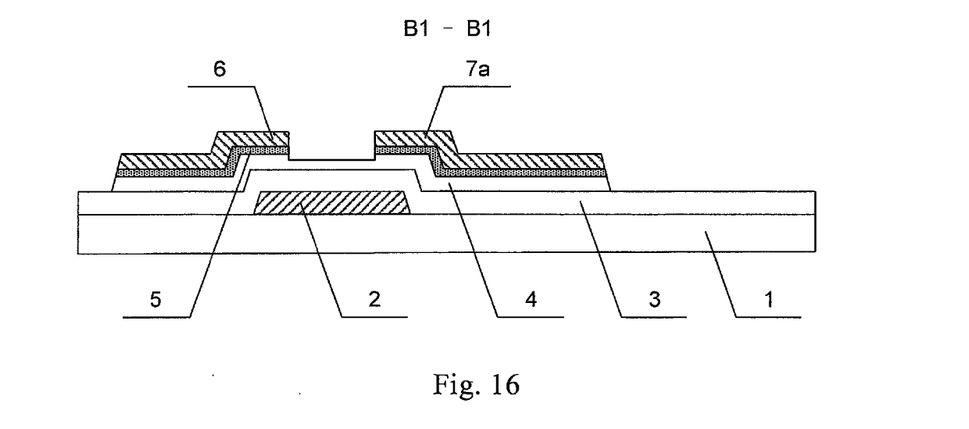

First, a gate insulating film, a semiconductor film and a doped semiconductor film are deposited sequentially, and then a source/drain metal film is deposited. A layer of photoresist is applied on the source/drain metal film. An exposure process is performed by using a half tone or grey tone mask, and after development, the photoresist is formed with a completely exposed region (photoresist-completely-removed region), a non-exposed region (photoresist-completely-remained region), and a partially exposed region (photoresist-partially-remained region). The non-exposed region corresponds to a region where the patterns of the data line, the source electrode and the metal drain electrode are located; the partially exposed region corresponds to a region where the pattern of the TFT channel region is located; and the completely exposed region corresponds to a region other than the above regions. In the photoresist-completely-removed region, the source/drain metal film is etched away by a wet etching process, and then the doped semiconductor film and the semiconductor film are etched away by a dry etching process so that the patterns including the active layer and the data line are formed. By an ashing process, the photoresist in the photoresist-completely-remained region is removed so as to expose the source/drain metal film in the region. By a second etching process, the source/drain metal film and the doped semiconductor film are etched away in the region and the semiconductor film is partially etched in the thickness direction so as to form the patterns including a source electrode, a metal drain electrode and a TFT channel region. Finally, the remaining photoresist is removed, and the second patterning process is completed. After the patterning process, the active layer (including the stack of the semiconductor layer 4 and the doped semiconductor layer 5) is formed on the gate insulating layer 3 and located over the gate electrode 2. The source electrode 6 and the metal drain electrode 7a is formed on the active layer. One end of the source electrode 6 is formed above the gate electrode 2, and the other end of it is connected with the data line 12. One end of the metal drain electrode 7a is located over the gate electrode 2 and provided opposite to the source electrode 6. The TFT channel region is formed between the source electrode 6 and the metal drain electrode 7a. The doped semiconductor layer 5 in the TFT channel region is etched away and the semiconductor layer 4 in the region is partially etched in the thickness direction so that the semiconductor layer 4 is exposed in the TFT channel region, as shown in FIGS. 15 and 16.

Figure 17:
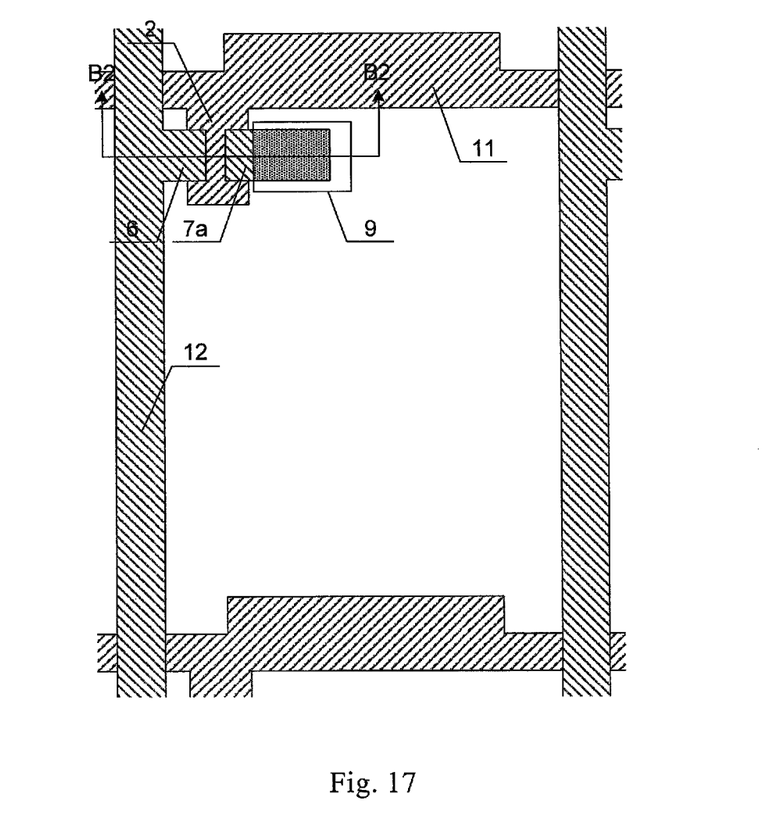
Figure 18:
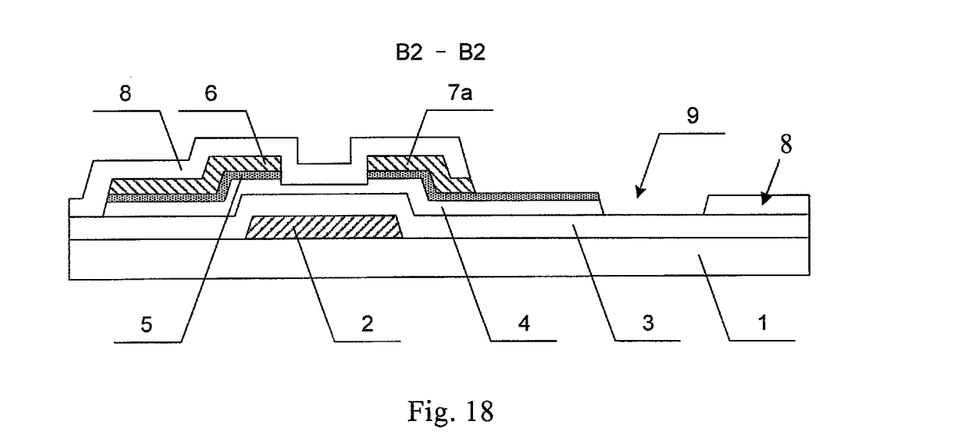

The third patterning process of the manufacturing solution is described as follows. First, a passivation layer 8 is deposited by a PECVD method, and then a layer of photoresist is applied on the passivation layer. An exposure process is performed by using a half tone or grey tone mask, and after development, the photoresist is formed with a completely exposed region (photoresist-completely-removed region), a non-exposed region (photoresist-completely-remained region), and a partially exposed region (a photoresist-partially-remained region). The completely exposed region corresponds to a region where the pattern of the passivation layer via hole is located; the partially exposed region corresponds to a region where the patterns of the gate connecting line via hole and the data connecting line via hole are located; and the non-exposed region corresponds to a region other than the above regions. First, a first etching process is performed so as to etching away the passivation layer 8 in the completely exposed region, so as to a pattern of passivation layer via hole 9. Sequentially, the metal drain electrode 7a in the passivation layer via hole 9 is further etched so as to expose the surface of the doped semiconductor layer of the active layer in the passivation layer via hole 9. Thereafter, an ashing process is performed, and the photoresist in the partially exposed region is removed by the ashing process so as to expose the passivation layer 8 in the region. Thereafter, a second etching process is performed, the pattern of the gate connecting line via hole is formed in the gate line PAD, and the pattern of the data connecting line via hole is formed in the gate line PAD. Finally, the remaining photoresist is removed and the third patterning process is completed, as shown in FIGS. 17 and 18. Since the metal drain electrode and the source electrode are provided in the same layer and are formed in the same patterning process, the metal drain electrode is covered with the passivation layer.

A manufacturing method of a TFT-LCD array substrate according to a first embodiment of the invention comprising:

Step 11, depositing a gate metal film on a substrate and forming patterns including a gate line and a gate electrode by a patterning process;

Step 12, depositing a gate insulating layer, a semiconductor film, a doped semiconductor film and a source/drain metal film on the substrate after the proceeding step, and forming patterns including an active layer, a data line and a source electrode by a patterning process with a three-tone mask;

Step 13, depositing a passivation layer on the substrate after the proceeding step, and forming a pattern of a passivation layer via hole by a patterning process, wherein the passivation layer via hole comprises a drain electrode region;

Step 14, depositing a transparent conductive film on the substrate after the above step, and forming patterns of a transparent drain electrode and a pixel electrode which are in an integral structure and connected with each other.

In one example, the step 12 may comprise the following process:

depositing the gate insulating layer, the semiconductor film and the doped semiconductor film sequentially by a plasma enhanced chemical vapor deposition;

depositing the source/drain metal film by a magnetic sputtering or thermal evaporation method;

applying a layer of photoresist on the source/drain metal film;

exposing the photoresist layer with a three-tone mask and forming the photoresist, after development, into a photoresist-completely-remained region, a photoresist-completely-removed region, a first photoresist-partially-remained region and a second photoresist-partially-remained region, wherein the photoresist-completely-remained region corresponds to a region where the patterns of the data line and the source electrode are located; the first photoresist-partially-remained region corresponds to a region where a pattern of a TFT channel region is located; the second photoresist-partially-remained region corresponds to region where a drain electrode is located; and the photoresist-completely-removed region corresponds to a region other than the above regions;

in the photoresist-completely-removed region, first etching away the source/drain metal film by a wet etching process, and then etching away the doped semiconductor film and the semiconductor film by a dry etching process;

by an ashing process, removing the photoresist in the first photoresist-partially-remained region so as to expose the source/drain metal film in the region;

etching away the source/drain metal film and the doped semiconductor film in the first photoresist-partially-remained region by a second dry etching process, and partially etching the semiconductor film in the region in the thickness direction so as to expose the semiconductor film, and at the same time, etching away the source/drain metal film in the second photoresist-partially-remained region so as to expose the doped semiconductor film; and removing the remaining photoresist.

The thickness of the photoresist in the photoresist-completely-remained region is 25000 Å to 30000 Å, the thickness of the first photoresist-partially-remained region is 3000 Å to 6000 Å, the thickness of the second photoresist-partially-remained region is 12000 Å to 18000 Å. The above process has been described in detail with reference to FIGS. 3-13, which will not be repeated here.

Alternatively, in another example, the step 12 may comprises the following:

depositing the gate insulating layer, the semiconductor film and the doped semiconductor film sequentially by a plasma enhanced chemical vapor deposition;

depositing the source/drain metal film by a magnetic sputtering or thermal evaporation method;

applying a layer of photoresist on the source/drain metal film;

exposing the photoresist with a three-tone mask and forming, after development, the photoresist into a photoresist-completely-remained region, a photoresist-completely-removed region, a first photoresist-partially-remained region and a second photoresist-partially-remained region, wherein the photoresist-completely-remained region corresponds to a region where the patterns of the data line and the source electrode are located; the first photoresist-partially-remained region corresponds to a region where a pattern of a TFT channel region is located; the second photoresist-partially-remained region corresponds to a region where a drain electrode is located; and the photoresist-completely-removed region corresponds to a region other than the above regions;

in the photoresist-completely-removed region, first etching away the source/drain metal film by a wet etching process, and then etching away the doped semiconductor film and the semiconductor film by a dry etching process;

by a first ashing process, removing the photoresist in the first photoresist-partially-remained region so as to expose the source/drain metal film in this region;

by a second dry etching, etching away the source/drain metal film and the doped semiconductor film in the first photoresist-partially-remained region, and partially etching the semiconductor film in the region in the thickness direction so as to expose the semiconductor film;

by a second ashing process, removing the photoresist in the second photoresist-partially-remained region so as to expose the source/drain metal film in the region;

by a third wet etching process, etching away the source/drain metal film in the second photoresist-partially-remained region so as to expose the doped semiconductor film; and removing the remaining photoresist.

The above process has been described in detail with reference to FIGS. 14a-14g.

A manufacturing method of a TFT-LCD array substrate according to a second embodiment of the invention comprises:

Step 21, depositing a gate metal film on a substrate and forming patterns including a gate line and a gate electrode by a patterning process;

Step 22, depositing a gate insulating layer, a semiconductor film, a doped semiconductor film and a source/drain metal film on the substrate after the proceeding step, and forming patterns including an active layer, a data line, a source electrode and a metal drain electrode by a patterning process with a half tone or grey tone mask;

Step 23, depositing a passivation layer on the substrate after the proceeding step, and forming a pattern of a passivation layer via hole by a patterning process, wherein the passivation layer via hole comprises a part or all of the metal drain electrode region, and the metal drain electrode in the passivation layer via hole is etched away so as to expose the surface of the doped semiconductor layer of the active layer; and Step 24, depositing a transparent conductive film on the substrate after the preceding step, and forming patterns including a transparent conductive electrode and a pixel electrode which are in an integral structure and connected with each other.

In one example, the step 22 may comprise:

depositing the gate insulating layer, the semiconductor film and the doped semiconductor film sequentially by a plasma enhanced chemical vapor deposition;

depositing the source/drain metal film by a magnetic sputtering or a thermal evaporation method;

applying a layer of photoresist on the source/drain metal film;

exposing the photoresist by using a half tone or grey tone mask and forming the photoresist, after development, into a photoresist-completely-remained region, a photoresist-completely-removed region, and a photoresist-partially-remained region, wherein the photoresist-completely-remained region corresponds to a region where the patterns of the data line, the source electrode and the metal drain electrode are located; the photoresist-partially-remained region corresponds to a region where the pattern of the TFT channel region is located; and the photoresist-completely-removed region corresponds to a region other than the above regions;

in the photoresist-completely-removed region, first etching away the source/drain metal film by a wet etching process, and then etching away the doped semiconductor film and the semiconductor film by a dry etching process;

by an ashing process, removing the photoresist in the photoresist-partially-remained region so as to expose the source/drain metal film in this region;

by a second etching process, etching away the source/drain metal film and the doped semiconductor film in the photoresist-partially-remained region, and partially etching the semiconductor film in the thickness direction so as to expose the semiconductor film; and removing the remaining photoresist.

In one example, the step 23 may comprise:

depositing a passivation layer by a plasma enhanced chemical vapor deposition;

applying a layer of photoresist on the passivation layer;

exposing process by using a half tone or grey tone mask and forming the photoresist, after development, into a photoresist-completely-remained region, a photoresist-completely-removed region, and a photoresist-partially-remained region, wherein the photoresist-completely-removed region corresponds to a region where the pattern of the passivation layer via hole is located; the photoresist-completely-remained region corresponds to a region where the patterns of the gate connecting line via hole and the data connecting line via hole are located; and the photoresist-completely-remained region corresponds to a region other than the above regions;

by a first etching process, forming a pattern of passivation layer via hole, simultaneously, etching away the metal drain electrode in the passivation layer via hole so as to expose the surface of the doped semiconductor layer of the active layer in the passivation layer via hole;

performing an ashing process to remover the photoresist in the photoresist-partially-remained region so as to expose the passivation layer in the region;

performing a second etching process so as to form the pattern of the gate connecting line via hole in the gate line PAD and the pattern of the data connecting line via hole in the gate line PAD; and removing the remained photoresist.

The above process is a method in which the metal drain electrode is etched when forming the passivation layer via hole.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A manufacturing method of a thin film transistor liquid crystal display (TFT-LCD) array substrate, comprising:
   Step 1, depositing a gate metal film on a substrate and forming patterns including a gate line and a gate electrode by a patterning process;
   Step 2, forming patterns including an active layer, a data line, a source electrode and a passivation layer via hole in a passivation layer with on the substrate after step 1, wherein the passivation layer via hole exposes the surface of the active layer in the drain electrode region; and
   Step 3, depositing a transparent conductive film on the substrate after step 2 and forming patterns of a transparent drain electrode and a pixel electrode which are in an integral structure and connected with each other, wherein the step 2 comprises:
   Step 201, depositing a gate insulating layer, a semiconductor film, a doped semiconductor film and a source/drain metal film on the substrate after step 1, forming patterns including the active layer, the data line and the source electrode by a patterning process with a three-tone mask, and exposing the doped semiconductor film in the drain electrode region, wherein the active layer includes the semiconductor film and the doped semiconductor film; and
   Step 202, depositing a passivation layer on the substrate after step 201, and forming the pattern of the passivation layer via hole by a patterning process, wherein the passivation layer via hole comprises the drain electrode region.

2. The manufacturing method of the TFT-LCD array substrate of claim 1, wherein the step 201 comprising:
   depositing the gate insulating layer, the semiconductor film, the doped semiconductor film, and the source/drain metal film sequentially;
   applying a layer of photoresist on the source/drain metal film;
   exposing the photoresist with the three-tone mask and forming the photoresist, after development, into a photoresist-completely-remained region, a photoresist-completely-removed region, a first photoresist-partially-remained region and a second photoresist-partially-remained region, wherein the photoresist-completely-remained region corresponds to a region where the patterns of the data line and the source electrode are located; the first photoresist-partially-remained region corresponds to a region where a pattern of a TFT channel region is located; the second photoresist-partially-remained region corresponds to a drain electrode region; and the photoresist-completely-removed region corresponds to a region other than the above regions;
   in the photoresist-completely-removed region, first etching away the source/drain metal film by a wet etching process, and then etching away the doped semiconductor film and the semiconductor film by a dry etching process; and
   forming the pattern of the TFT channel region by an ashing process and a etching process.

3. The manufacturing method of the TFT-LCD array substrate of claim 2, wherein forming the pattern of the TFT channel region by an ashing process and an etching process comprising:
   by the ashing process, the photoresist in the first photoresist-partially-remained region is removed so as to expose the source/drain metal film in the region;
   etching away the source/drain metal film and the doped semiconductor film in the first photoresist-partially-remained region by a second dry etching process, partially etching the semiconductor film in the region in the thickness direction so as to expose the semiconductor film, and at the same time, etching away the remaining photoresist and the source/drain metal film in the second photoresist-partially-remained region so as to expose the doped semiconductor film; and
   removing the remaining photoresist.

4. The manufacturing method of the TFT-LCD array substrate of claim 3, wherein the thickness of the photoresist in the photoresist-completely-remained region is 25000 Å to 30000 Å, the thickness of the first photoresist-partially-remained region is 3000 Å to 6000 Å, and the thickness of the second photoresist-partially-remained region is 12000 Å to 18000 Å.

5. The manufacturing method of the TFT-LCD array substrate of claim 2, wherein forming the pattern of the TFT channel region by an ashing process and an etching process comprising:
   by a first ashing process, removing the photoresist in the first photoresist-partially-remained region so as to expose the source/drain metal film in this region;
   by a second dry etching, etching away the source/drain metal film and the doped semiconductor film in the first photoresist-partially-remained region and partially etching the semiconductor film in the region in the thickness direction so as to expose the semiconductor film;
   by a second ashing process, removing the photoresist in the second photoresist-partially-remained region so as to expose the source/drain metal film in the region;
   by a third wet etching process, etching away the source/drain metal film in the second photoresist-partially-remained region so as to expose the doped semiconductor film; and
   removing the remaining photoresist.

6. A manufacturing method of a thin film transistor liquid crystal display (TFT-LCD) array substrate, comprising:
   Step 1, depositing a gate metal film on a substrate and forming patterns including a gate line and a gate electrode by a patterning process;
   Step 2, forming patterns including an active layer, a data line, a source electrode and a passivation layer via hole in a passivation layer with on the substrate after step 1, wherein the passivation layer via hole exposes the surface of the active layer in the drain electrode region; and
   Step 3, depositing a transparent conductive film on the substrate after step 2 and forming patterns of a transparent drain electrode and a pixel electrode which are in an integral structure and connected with each other, wherein the step 2 comprises:
   Step 211, depositing a gate insulating layer, a semiconductor film, a doped semiconductor film and a source/drain metal film sequentially on the substrate after step 1, and forming patterns including the active layer, the data line, the source electrode and the metal drain electrode by a patterning process with a half tone or grey tone mask, wherein the active layer comprises the semiconductor film and the doped semiconductor film; and Step 212, depositing a passivation layer on the substrate after step 211, and forming the pattern of the passivation layer via hole by a patterning process, wherein the passivation layer via hole comprises a part or all of the metal drain electrode region, and the metal drain electrode in the passivation layer via hole is etched away so as to expose the surface of the doped semiconductor layer of the active layer.

7. The manufacturing method of the TFT-LCD array substrate of claim 6, wherein the step 211 comprising:
   depositing the gate insulating layer, the semiconductor film, the doped semiconductor film, and the source/drain metal film sequentially;
   applying a layer of photoresist on the source/drain metal film;
   exposing the photoresist by using a half tone or grey tone mask and forming the photoresist, after development, into a photoresist-completely-remained region, a photoresist-completely-removed region, and a photoresist-partially-remained region, wherein the photoresist-completely-remained region corresponds to a region where the patterns of the data line, the source electrode and the metal drain electrode are located; the photoresist-partially-remained region corresponds to a region where the pattern of the TFT channel region is located; and the photoresist-completely-removed region corresponds to a region other than the above regions;
   in the photoresist-completely-removed region, first etching away the source/drain metal film by a wet etching process, and then etching away the doped semiconductor film and the semiconductor film by a dry etching process;
   by an ashing process, removing the photoresist in the photoresist-partially-remained region so as to expose the source/drain metal film in the region;
   by a second etching process, etching away the source/drain metal film and the doped semiconductor film in the photoresist-partially-remained region and partially etching the semiconductor film in the thickness direction so as to expose the semiconductor film; and
   removing the remaining photoresist.

8. The manufacturing method of the TFT-LCD array substrate of claim 6, wherein the step 212 comprises:
   depositing the passivation layer;
   applying a layer of photoresist on the passivation layer;
   exposing the photoresist by using a half tone or grey tone mask and forming the photoresist, after development, into a photoresist-completely-remained region, a photoresist-completely-removed region, and a photoresist-partially-remained region, wherein the photoresist-completely-removed region corresponds to a region where the pattern of the passivation layer via hole is located; the photoresist-completely-remained region corresponds to a region where the patterns of a gate connecting line via hole and a data connecting line via hole are located; and the photoresist-completely-remained region corresponds to a region other than the above regions;
   by a first etching process, forming a pattern of passivation layer via hole and at the same time etching away the metal drain electrode in the passivation layer via hole so as to expose the surface of the doped semiconductor layer of the active layer in the passivation layer via hole;
   by an ashing process, removing the photoresist in the photoresist-partially-remained region so as to expose the passivation layer in this region;
   by a second etching process, forming the pattern of the gate connecting line via hole in a gate line pad region and the pattern of the data connecting line via hole in a data line pad region; and
   removing the remaining photoresist.

* * * * *